(12) United States Patent
Obata

(10) Patent No.: US 9,406,982 B2
(45) Date of Patent: Aug. 2, 2016

(54) SECONDARY BATTERY REUSE METHOD, VEHICLE DRIVE POWER SOURCE, AND VEHICLE

(71) Applicant: Hiroyuki Obata, Nagoya (JP)

(72) Inventor: Hiroyuki Obata, Nagoya (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 247 days.

(21) Appl. No.: 14/360,179

(22) PCT Filed: Nov. 23, 2012

(86) PCT No.: PCT/IB2012/002452
§ 371 (c)(1),
(2) Date: May 22, 2014

(87) PCT Pub. No.: WO2013/076565
PCT Pub. Date: May 30, 2013

(65) Prior Publication Data
US 2015/0093611 A1   Apr. 2, 2015

(30) Foreign Application Priority Data
Nov. 24, 2011   (JP) ................. 2011-256281

(51) Int. Cl.
*H01M 2/00* (2006.01)
*H01M 10/54* (2006.01)
*G01R 31/36* (2006.01)
(Continued)

(52) U.S. Cl.
CPC ........... *H01M 10/54* (2013.01); *G01R 31/3662* (2013.01); *G01R 31/3679* (2013.01); *H01M 10/4207* (2013.01); *H01M 10/052* (2013.01); *H01M 2220/20* (2013.01); *Y02W 30/84* (2015.05); *Y10T 29/49004* (2015.01)

(58) Field of Classification Search
CPC .............. H01M 10/54; H01M 10/052; H01M 10/4207; H01M 2220/20; Y10T 29/49004; Y02W 30/84; G01R 31/3662; G01R 31/3679
See application file for complete search history.

(56) References Cited

U.S. PATENT DOCUMENTS

| 6,232,743 | B1 * | 5/2001 | Nakanishi | ........... B60L 11/1803 320/103 |
| 2003/0224241 | A1 * | 12/2003 | Takada | ................ H01M 10/425 429/52 |
| 2006/0012330 | A1 | 1/2006 | Okumura et al. | |

(Continued)

FOREIGN PATENT DOCUMENTS

| EP | 1786057 A2 | 5/2007 |
| EP | 2 555 311 | 2/2013 |

(Continued)

*Primary Examiner* — Raymond Alejandro
(74) *Attorney, Agent, or Firm* — Finnegan, Henderson, Farabow, Garrett & Dunner, LLP

(57) ABSTRACT

Secondary battery reuse method in which, when used secondary battery packs G and A in a lithium secondary battery have become unusable, the resistances and capacities of a plurality of secondary battery stacks constituting the secondary battery pack G are measured and a reusable secondary battery stack is selected and separated therefrom by comparing these measured resistances and capacities with a resistance threshold value H and a capacity threshold value I, respectively. In addition, a new secondary battery pack is rebuilt (constructed) by combining the secondary battery stack with a secondary battery stack that has been determined to be reusable in the secondary battery pack A in the same manner as in the secondary battery pack G.

8 Claims, 9 Drawing Sheets

(51) Int. Cl.
   *H01M 10/42* (2006.01)
   *H01M 10/052* (2010.01)

(56) References Cited

U.S. PATENT DOCUMENTS

| 2007/0108946 A1* | 5/2007 | Yamauchi | H01M 10/42 |
| | | | 320/132 |
| 2009/0284226 A1 | 11/2009 | Komori et al. | |
| 2011/0239445 A1* | 10/2011 | Ibi | H01M 2/1077 |
| | | | 29/623.1 |
| 2013/0018610 A1 | 1/2013 | Yamauchi et al. | |

FOREIGN PATENT DOCUMENTS

| JP | 2003-297434 | 10/2003 |
| JP | 2004-185915 | 7/2004 |
| JP | 2007-141464 | 6/2007 |
| JP | 2007-195312 | 8/2007 |
| JP | 2009-277627 | 11/2009 |
| WO | WO 2004/051296 A1 | 6/2004 |
| WO | WO 2011-121755 | 10/2011 |

* cited by examiner

F I G . 4A
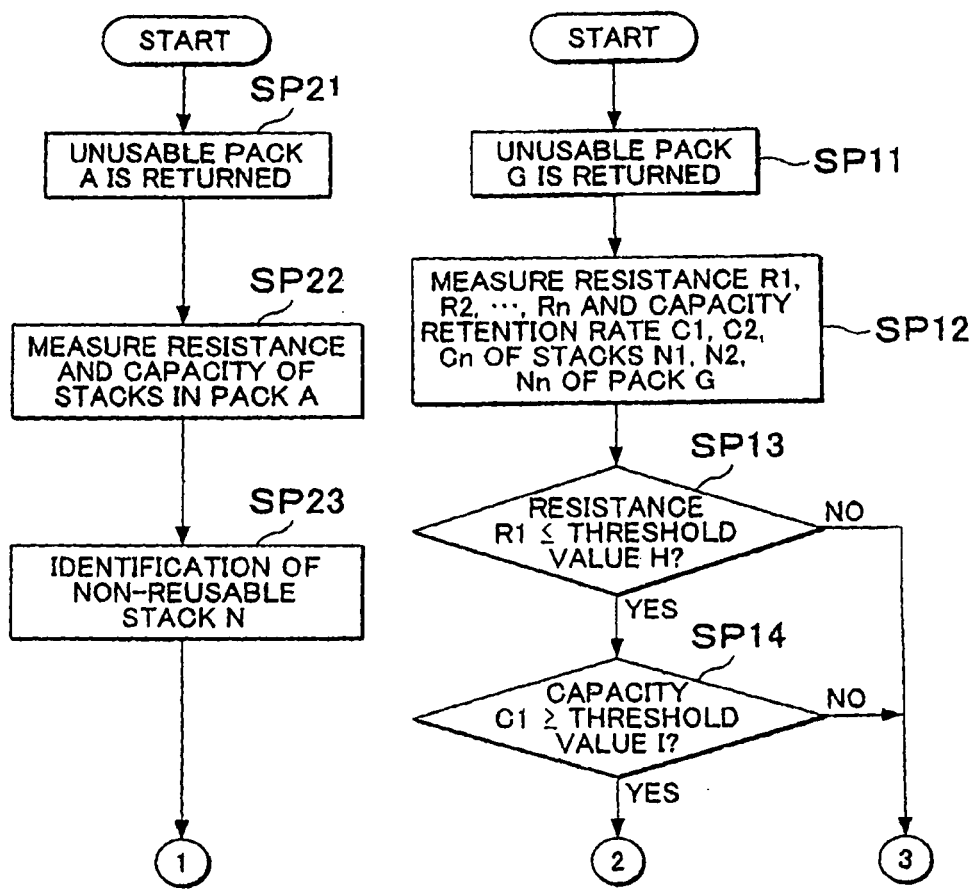

F I G . 6
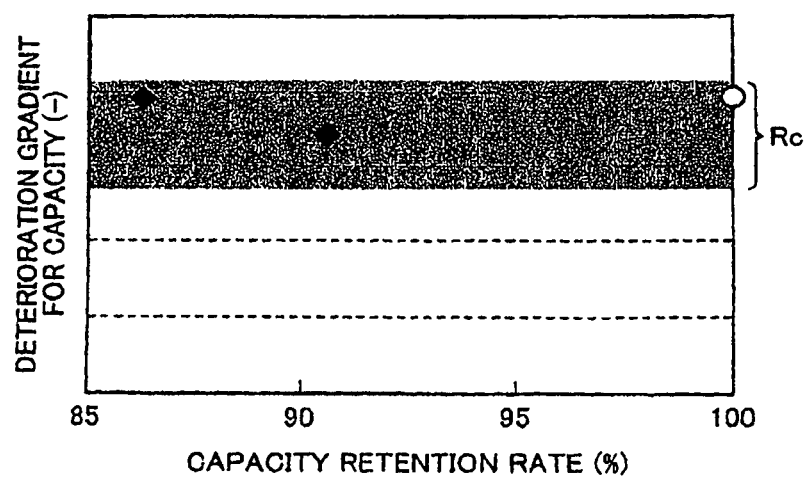

F I G . 7
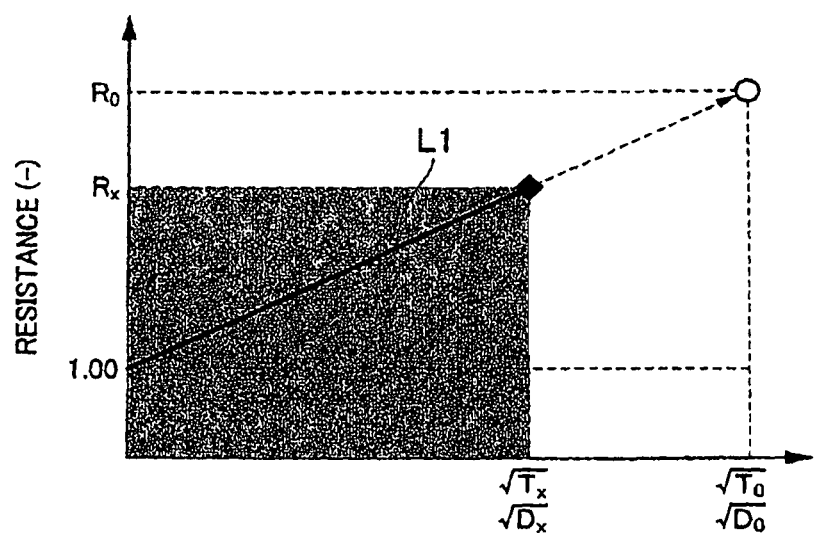

SECONDARY BATTERY REUSE METHOD, VEHICLE DRIVE POWER SOURCE, AND VEHICLE

CROSS-REFERENCE TO RELATED APPLICATIONS

This application is a national phase application of International Application No. PCT/IB2012/002452, filed Nov. 23, 2012, and claims the priority of Japanese Application No. 2011-256281, filed Nov. 24, 2011, the content of both of which is incorporated herein by reference.

BACKGROUND OF THE INVENTION

1. Field of the Invention

The invention relates to recycle of secondary batteries (including recycling, muse, remanufacturing, and so forth) and particularly to a recycling technology for non-aqueous electrolyte secondary batteries used as vehicle drive power sources.

2. Description of Related Art

For example, Japanese Patent Application Publication No. 2007-141464 (JP-2007-141464 A) proposes a secondary battery reuse system designed such that, even when a secondary battery system is disassembled, various information on the secondary battery modules constituting this system can be losslessly maintained. In this secondary battery reuse system, the electrical characteristic information and use history information of a secondary battery module are retrieved from the secondary battery module using external interface means, and a reuse grade classification is performed on the secondary battery module by a battery information management device based on the retrieved information.

However, while JP-2007-141464 A does teach the determination of whether or not a used secondary battery module is reusable by setting a threshold value for a property value of the secondary battery module for use in the reuse grade classification, it does not specify specific criteria and procedures according to the reuse configuration of the used secondary battery module.

For example, as a reuse configuration for a used secondary battery module, the case where the used secondary battery module is used in combination with an unused secondary battery module can be envisioned; however, the criteria for setting the threshold value for determining reusability in such a case and the criteria in connection with combining a used secondary battery module with an unused secondary battery module are unclear in the secondary battery reuse system described in JP-2007-141464 A. As a consequence, when an unused secondary battery module is used in combination with a used secondary battery module that has been rated as reusable, unexpected problems or malfunctions may be produced that are caused by variations in performance (non-uniformity, inconsistency) between the secondary battery modules.

This also applies to the case where a used secondary battery module is used in combination with a secondary battery module that has already been placed in use but is still usable as equivalent to the unused article (new article) as a secondary battery module unit.

SUMMARY OF THE INVENTION

The invention makes it possible the reuse of a portion of a used secondary battery as a vehicle drive power source and makes it possible when it is done to obtain a desirable battery performance even when using a used secondary battery in combination with an unused secondary battery or a secondary battery equivalent to unused. The invention additionally provides, a secondary battery reuse method that can prevent the appearance of problems and malfunctions caused by variations in performance between the two, a vehicle drive power source that has a secondary battery that has been reconstructed (rebuilt) using this method, and a vehicle in which this vehicle drive power source is mounted.

When a used secondary battery is reused, use in combination with an unused secondary battery is generally not a recommended practice, although this also depends on the secondary battery connection mode. While an unconditional statement cannot be made here, when an already used secondary battery having a deteriorated (loss, decline) capacity is used without regeneration in combination with an unused secondary battery, for example, the loads sustained by the two differ from the levels predicted from a design standpoint. In particular, this is done in order to prevent the appearance of unanticipated phenomena due to a load equal to or greater than a predicted load on the used secondary battery.

Responding to this the inventor focused on various properties of used secondary batteries that had been used as a vehicle drive power source and carried out extensive and intensive investigations into the possibilities for the reliable reuse of such used secondary batteries. It was discovered as a result that when operation was carried out with an unused secondary battery connected in series with a used secondary battery having different capacity retention rates, a range existed in which the two were equal to each other in their degree of deterioration (percentage increase in resistance and percentage decline in capacity). Based on this, the inventor also confirmed that, by an appropriate determination in terms of both resistance and capacity of the reusability of a used secondary battery, a desirable battery performance can be obtained even when a used secondary battery is used in combination with an unused secondary battery or a secondary battery equivalent to unused, and that particular problems and malfunctions are also not produced.

Thus, with regard to a secondary battery that is provided with a secondary battery peck that has a plurality of modules, each module being formed of a secondary battery cell or a secondary battery stack containing a plurality of secondary battery cells, the secondary battery reuse method according to a first aspect of the invention includes: measuring a resistance and a capacity of each module; comparing the measured resistance of each module with a preset first threshold value; comparing the measured capacity of each module with a preset second threshold value; determining a module to be a reusable module when its measured resistance is less than or equal to the first threshold value and its measured capacity is greater than or equal to the second threshold value; determining a module to be a non-reusable module when its measured resistance is larger than (exceeds) the first threshold value or its measured capacity is less than (smaller than) the second threshold value; constructing (rebuilding) a new secondary battery pack by combining the module thus determined to be reusable with an unused module or a module equivalent to an unused module, and placing a secondary battery provided with this new secondary battery pack in use.

In this aspect, a new secondary battery pack may be constructed (rebuilt) by combining an unused module (new article), or a module equivalent to an unused module, with a module in a used first secondary battery pack determined to be reusable.

The preceding aspect may also take the form of an aspect in which the new secondary battery pack is constructed by exchanging a module in a used first secondary battery pack determined to be reusable, with a module in a (separate) used second secondary battery pack that is different from the first secondary battery pack determined to be non-reusable.

The preceding aspect may also take the form of an aspect in which the new secondary battery pack is constructed by exchanging a module in a used first secondary battery pack determined to be reusable, with an unused (new article) module.

The condition that a degree of deterioration in the resistance and a degree of deterioration is the capacity of a module in a used secondary battery pack are respectively equal to a degree of deterioration in the resistance and a degree of deterioration in the capacity of a module in an unused (prior to use) secondary battery pack, may be used in the preceding aspect when setting the first threshold value relating to the resistance of the module and the second threshold value relating to the capacity of the module.

The inventor selected various modules (individual secondary battery cells, individual secondary battery stacks) in secondary battery packs that after having been placed in use no longer satisfied standard values for, for example, output (unusable secondary batteries in the invention); carried out charge/discharge operations in a state serially connected with an unused article; and measured and evaluated the state of deterioration of each module. As a result, for used modules having a resistance and capacity within certain ranges, the inventor confirmed relative to their (resistance and capacity) degree of deterioration that no substantial difference from an unused module was observed and they were equal to each other.

As indicated above, the inventor measured the resistance and capacity on used modules and compared these measured values with the target life required of or established for secondary batteries. With this comparison method, for example, by establishing the first threshold value (resistance threshold value) and the second threshold value (capacity threshold value) according to a so-called "root law" and comparing these threshold values with the values measured for a used module, it was possible to reliably detain whether the module was reusable.

In the aspect indicated above, the module in the secondary battery pack may be provided with an electrode assembly that has a positive electrode containing a positive electrode active material, a negative electrode containing a negative electrode active material, and a non-aqueous electrolyte solution containing a lithium salt in a non-aqueous solvent, and this secondary battery pack may be used as a vehicle drive power source mounted in a vehicle.

The vehicle drive power source according to a second aspect of the invention is provided with a secondary battery that is mounted in a vehicle and that has the new secondary battery pack constructed by the secondary battery reuse method according to the invention as described above.

The vehicle according to a third aspect of the Invention is provided with a vehicle drive power source according to the preceding aspect of the invention.

In this case, a more advantageous aspect of the vehicle according to the third aspect is an aspect that ii additionally provided with a control unit that controls an operation of the secondary battery pack, e.g., controls charging and discharging, wherein this control unit is structured to carry out control of an operation of a newly constructed (rebuilt) secondary battery pack, e.g., control of charging and discharging based on use history and/or battery characteristics of the reusable used module used in this secondary battery pack.

By proceeding in this manner, the appearance in a new secondary battery pack that combines a used module with an unused module of unforeseeable malfunctions and problems in particular in the reusable used module can be more efficiently prevented than in the case where control of the operation of the secondary battery pack is carried out based on values obtained by simply averaging the use history and battery characteristics of each of the modules.

The invention performs a comparison of the measured values for the resistance and capacity of each module with the first threshold value and the second threshold value, respectively, based on the new insight that the degrees of deterioration in the resistance and capacity of a module in the secondary battery pack in a used secondary battery are equal to the degrees of deterioration in the resistance and capacity of a module in an unused secondary battery pack. Reusable modules can be reliably sorted from non-reusable modules as a result. Accordingly, when a portion of a used secondary battery is reused for service as a vehicle drive power source, desirable battery characteristics can be reliably obtained even when using the combination of a used secondary battery with an unused secondary battery or a secondary battery equivalent to unused. In addition, the appearance of problems and malfunctions caused by performance variations between the two can be prevented. This can as a result promote a more efficient and a safer effective utilization of secondary batteries and their material resources.

The application of the invention is not intended to extend to cases in which an adequate output is not obtained from secondary battery during its product warranty period. In such a case, a suitable exchange with a new product may be carried out within the scope of the product warranty without carrying out repair and regeneration of the secondary battery using a reusable module recovered from a used secondary battery.

BRIEF DESCRIPTION OF THE DRAWINGS

The features, advantages, and technical and industrial significance of this invention will be described in the following detailed description of example embodiments of the invention with reference to the accompanying drawings, in which like numerals denote like elements, and wherein:

FIGS. 4A and 4B are flow diagrams that show an example of the procedure in a preferred embodiment according to the secondary battery reuse method according to the invention;

FIG. 6 is a graph that shows the results of measurement of the deterioration gradient of the capacity for a used module and an unused module;

FIG. 7 is a graph that conceptually illustrates an example of a method for setting the resistance threshold value H for determining whether a used module is reusable.

DETAILED DESCRIPTION OF EMBODIMENTS

Figure 1:
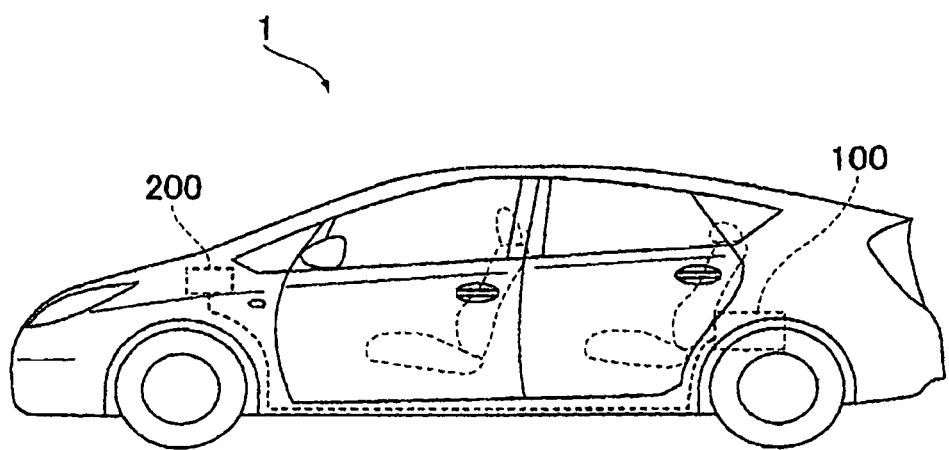
FIG. 1 is a schematic diagram that shows an embodiment of the vehicle according to the invention, in which a secondary battery used as a vehicle drive power source according to the invention is mounted.

Embodiments of the invention are described in detail in the following. Unless specifically stated otherwise, positional relationships, e.g., top and bottom, left and right, and so forth, are based on the positional relationships shown in the drawings. In addition, the dimensional ratios in die drawings are not limited to the ratios in the drawings. The following embodiments are examples for the purpose of describing the invention, but the invention is not intended to be limited to only these embodiments. Various modifications of the invention are possible insofar as they do hot depart from the essential features of the invention.

<The Vehicle and the Vehicle Drive Power Source>

Figure 2:
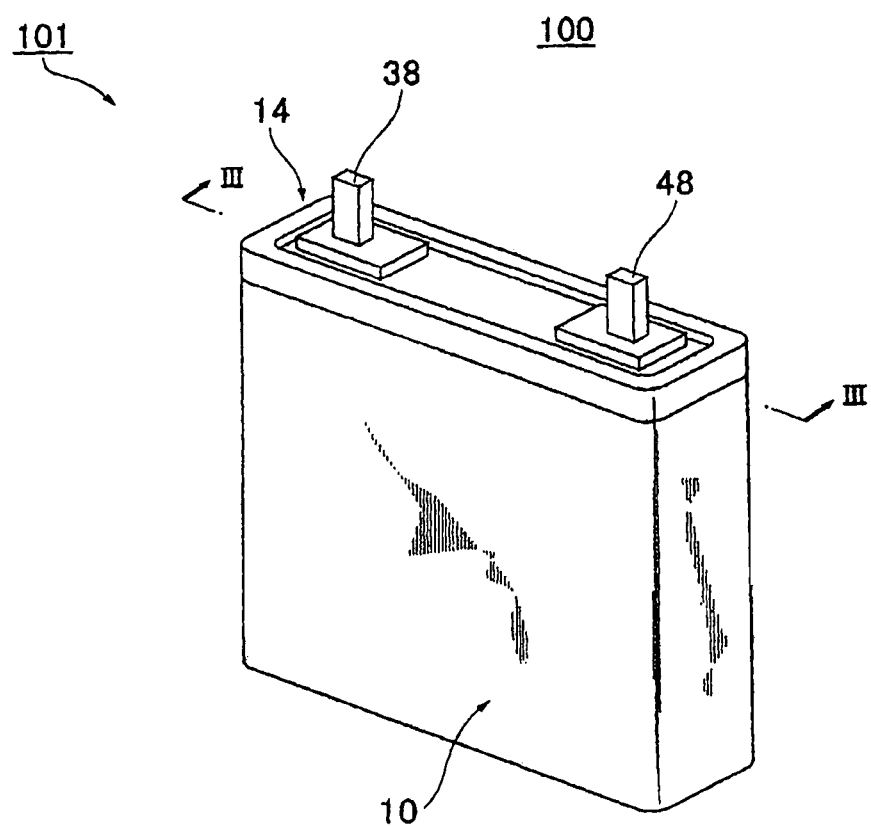
FIG. 2 is a perspective drawing that schematically shows the structure of a secondary battery cell that is provided in the secondary battery shown in FIG. 1.
Figure 3:
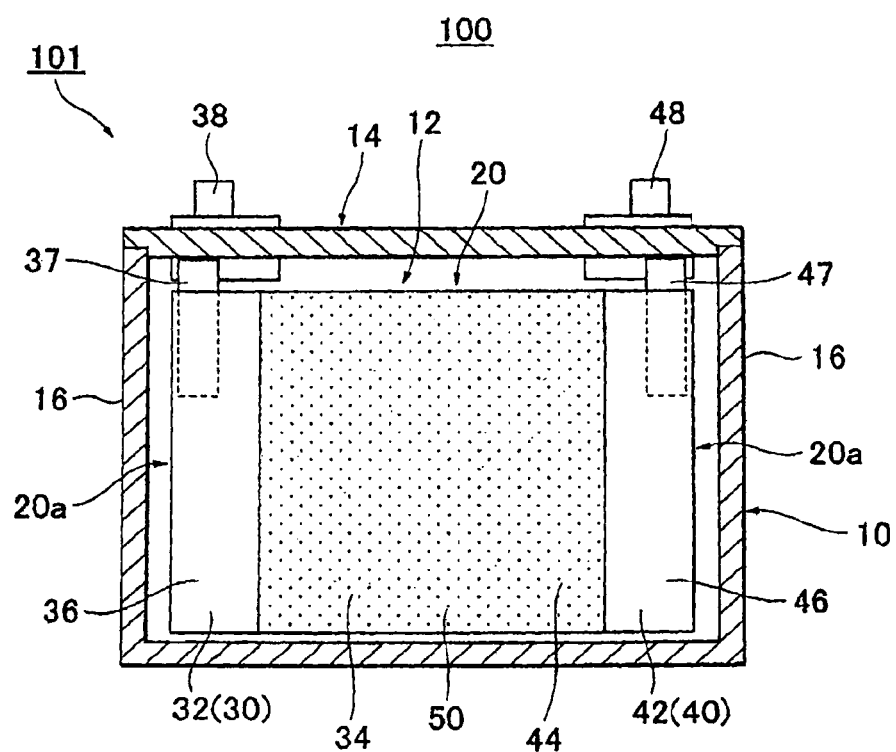
FIG. 3 is a cross-section diagram on the III-III line in FIG. 2.

FIG. 1 is a schematic diagram that shows an embodiment of the vehicle according to the invention, in which a secondary battery used as a vehicle drive power source according to the invention is mounted. FIG. 2 is a perspective drawing that schematically shows the structure of a secondary battery cell that is provided in the secondary battery shown in FIG. 1. FIG. 3 is a cross-sectional diagram on the III-III line in FIG. 2.

(The Secondary Battery)

As shown in FIG. 1, the vehicle 1 is, for example, an automobile and particularly an automobile equipped with n electric motor, such as a hybrid automobile, an electric automobile, or a fuel cell automobile, and is provided with a lithium secondary battery 100 (the secondary battery) and a control unit 200 connected thereto. The lithium secondary battery 100 is a non-aqueous electrolyte secondary battery that functions as a power source (vehicle drive power source) for driving the vehicle 1, and, for example, is provided with a secondary battery pack that has a plurality of sets of secondary battery stacks that are constructed from a plurality of secondary battery cells 101. Each of the secondary battery cells 101 and each of the secondary battery stacks correspond to a "module" in the invention.

As shown in FIG. 2 and FIG. 3, the secondary battery cell 101 of the lithium secondary battery 100 has a structure in which an electrode assembly 20—which is structured as a so-called winding in which a positive electrode and a negative electrode are stacked with an electrolyte-impregnated separator interposed therebetween—is loaded within a battery case 10 that has an approximately angular cylindrical shape (rectangular parallepiped shape) and in which the opening 12 in this case 10 is closed by a lid 14. A positive electrode terminal 38 and a negative electrode terminal 48 for external connection are disposed in the lid 14; a portion of the illustrated upper end side of the positive electrode terminal 38 and negative electrode terminal 48 protrudes to the outside from the surface of the lid 14; and the respective illustrated lower ends are connected 26 within the battery case 10 to the internal positive electrode terminal 37 and the internal negative electrode terminal 47.

In addition, the electrode assembly 20 is, for example, an electrode assembly in which a positive electrode sheet 30 having a positive electrode active material layer 34 on the surface of a long-sheet-shaped positive electrode current collector 32 and a negative electrode sheet 40 having a negative electrode active material layer 44 on the surface of a long-sheet-shaped negative electrode current collector 42 are wound in alternation with a long-sheet-shaped separator 50 therebetween. To obtain the electrode assembly 20 formed by this laminate, for example, a wound electrode assembly is obtained by winding in a cylindrical shape on the circumference of core (not shown) and is formed into a flat shape by flattening from the side surface direction and is disposed within the battery case 10 with its open ends 20a facing the side walls 16 of the battery case 10.

The internal positive electrode terminal 37 and the internal negative electrode terminal 47 referenced above are respectively joined by a suitable method, e.g., ultrasound welding, resistance welding, and so forth, to a positive electrode active material layer-fee region 36 of the positive electrode current collector 32 and a negative electrode active material layer-free region 46 of the negative electrode current collector 42, thereby making an electrical connection with the positive electrode sheet 30 and the negative electrode sheet 40 of the electrode assembly 20.

The separator 50 is interposed between the positive electrode sheet 30 and the negative electrode sheet 40 and is disposed to be in contact with both the positive electrode active material layer 34 provided on the positive electrode sheet 30 and the negative electrode active material layer 44 provided on the negative electrode sheet 40. A conduction path (electrical conduction pathway) is provided between the positive electrode and the negative electrode by impregnating the voids formed in this separator 50 with an electrolyte (non-aqueous electrolyte solution). The separator 50 has a width larger than the stacking footprint of the positive electrode active material layer 32 and the negative electrode active material layer 44 and smaller than the width of the electrode assembly 20 and is disposed to prevent internal short circuiting due to contact between the positive electrode current collect 32 and the negative electrode current collector 42 and is disposed sandwiched by the stacking footprints of the positive electrode active material layer 34 and the negative electrode active material layer 44.

The constituent material of this separator 50 is not particularly limited and those constituent materials available in this technical field can be used as appropriate. For example, a porous sheet of a resin (microporous resin sheet) is preferably used, and the type of resin here can be exemplified by polyolefin resins such as polypropylene and polyethylene and by polystyrene. The separator 50 may be a single layer (monolayer article) or may be a laminate of two layers or three or more layers.

(The Positive Electrode Sheet 30)

There are no particular limitations on the material for forming the positive electrode current collector 32 that forms the substrate for the positive sheet 30, and materials available in this technical field can be used as appropriate. Examples are metals that exhibit an excellent electrical conductivity, e.g., aluminum and alloys and composite metals in which aluminum is the main component.

The positive electrode active material layer 34 contains at least a positive electrode active material that is capable of incorporating and discharging the lithium ion, which functions as the charge carrier. Positive electrode active materials available in this technical field can be used as appropriate as the positive electrode active material under consideration. While there are no particular limitations here, an example is a lithium-transition metal complex oxide having a layer structure or a spinel structure and containing lithium (Li) and at least one transition metal element.

More specific examples are cobalt-lithium complex oxide ($LiCoO_2$); nickel-lithium complex oxide ($LiNiO_2$); manganese-lithium complex oxide ($LiMn_2O_4$); so-called binary system lithium-transition metal complex oxides that contain two transition metal elements, as given by $LiNi_xCo_{1-x}O_2$ ($0<x<1$) in the nickel.cobalt system, $LiCo_xMn_{1-x}O_2$ ($0<x<1$) in the cobalt.manganese system, and $LiNi_xMn_{1-x}O_2$ ($0<x<1$) and $LiNi_xMn_{2-x}O_4$ ($0<x<2$) in the nickel.manganese system; and ternary lithium-transition metal complex oxides, which contain three transition metal elements, such as the nickel.cobalt.manganese system (e.g., $LiNi_{1/3}Co_{1/3}Mn_{1/3}O_2$). These lithium-transition metal complex oxides have a potential in the range from approximately 3.5 to 4.2 V (potential versus the lithium reference electrode).

As its microconstituent metal elements, the lithium-transition metal complex oxide may contain, for example, one or two or more selections from the group consisting of aluminum (Al), chromium (Cr), iron (Fe), vanadium (V), magnesium (Mg), titanium (Ti), zirconium (Zr), niobium (Nb), molybdenum (Mo), tungsten (W), copper (Cu), zinc (Zn), gallium (Ga), indium (In), tin (Sn), lanthanum (La), and cerium (Ce).

For example, the lithium-transition metal oxide powders produced provided by conventional methods may be used as such as the lithium-transition metal oxide under consideration. Or, this lithium-transition metal oxide may be prepared by mixing the several starting compounds—selected as appropriate in conformity with the atomic composition—at a prescribed molar ratio and calcining by appropriate means. The calcined material may also be ground, granulated, and classified by appropriate means to obtain a lithium-transition metal oxide powder that is a particulate substantially composed of secondary particles having a desired average particle size and/or particle size distribution.

The positive electrode active material layer 34 may also contain, as an additive, a sacrificial auxiliary material that is a material degraded by an oxidation reaction with the additive present in the non-aqueous electrolyte, infra, accompanying discharge of the secondary battery cell 101 in the lithium secondary battery 100 and that makes possible regulation of the amount of coating produced on the surface of the positive electrode active material by this oxidation reaction.

This sacrificial auxiliary material preferably has a potential (potential with respect to the lithium reference electrode) that is baser than the potential of the positive electrode active material referenced above (approximately 3.5 to 4.2 V). An example is the olivine-structured lithium-containing phosphate salt represented by the general formula $LiMPO_4$ (in the formula, M represents at least one or two or more transition metal elements selected from the group consisting of Co, Ni, Mn, and Fe). Advantageous examples of this olivine-type lithium-containing phosphate salt are lithium iron phosphate ($LiFePO_4$) and lithium manganese phosphate ($LiMnPO_4$) (potential versus the lithium reference electrode=approximately 3.2 to 3.8 V).

There are no particular limitations on the combination of the previously described positive electrode active material with the sacrificial auxiliary material as long as the following relationship between the potentials (potential versus the lithium reference electrode) of the positive electrode active material and the sacrificial auxiliary material is satisfied: positive electrode active material>sacrificial auxiliary material. A preferred example here is a combination that uses a layer-structured $LiNi_{1/3}Co_{1/3}Mn_{1/3}O_2$ for the positive electrode active material and an olivine-structured $LiFePO_4$ for the sacrificial auxiliary material. Or, a layer-structured lithium-transition metal complex oxide may be used for the sacrificial auxiliary material; an example here is a combination that uses spinel-structured $LiMn_2O_4$ with its relatively high potential (approximately 4.2 V) as the positive electrode active material and that uses layer-structured $LiNiO_2$, which has a lower potential than that, as the sacrificial auxiliary material.

As necessary, the positive electrode active material layer 34 may also contain other components (optional components) available in this technical field, such as an electrical conductive material and a binder. This electrical conductive material can be exemplified by electrical conductive powder materials, e.g., carbon powder and carbon fiber. The carbon powder can be specifically exemplified by the various carbon blacks, for example, acetylene black, furnace black, and Ketjen black and by graphite powder. In addition, a single selection from the following or a mixture thereof may also be incorporated: electrical conductive fiber, e.g., carbon fiber, metal fiber, and so forth; the powder of a metal such as copper and nickel; and an organic electrical conductive material, e.g., a polyphenylene derivative.

Those binders available in this technical field may be used as appropriate as the binder without particular limitation, and various polymers may be used. Specifically, the use is preferred of a selection from polymers that are soluble or dispersible in the solvent used to prepare the positive electrode active material layer 34. Examples in the case of use of an aqueous solvent are water-soluble or water-dispersible polymers such as cellulosic polymers such as carboxymethyl cellulose (CMC) and hydroxypropylmethyl cellulose (HPMC); polyvinyl alcohol (PVA); fluororesins such as polytetrafluoroethylene (PTFE) and tetrafluoroethylene-hexafluoropropylene copolymer (FEP); vinyl acetate copolymers; and rubbers such as styrene-butadiene rubber (SBR) and acrylic acid-modified SBR resin (SBR latex). In the case of use of a non-aqueous solvent, the use is preferred of a polymer such as polyvinylidene fluoride (PVDF) and polyvinylidene chloride (PVDC). In addition to their binder function, the various polymers provided as examples are thought to also function as thickeners and as other additives.

(The Negative Electrode Sheet 40)

There are no particular limitations on the material used to form the negative electrode current collector 42, which provides the substrate for the negative electrode sheet 40, and the materials available in this technical field can be used as appropriate. Examples here are metals that exhibit an excellent electrical conductivity, e.g., copper and alloys and metal composites in which copper is the main component.

The negative electrode active material layer 44 contains at least a negative electrode active material that is capable of incorporating and discharging the lithium ion, which forms the charge carrier. This negative electrode active material is a material that degrades through a reduction reaction with the additive present in the non-aqueous electrolyte, infra, accompanying charging of the lithium secondary battery and that makes possible regulation of the amount of coating produced on the surface of the negative electrode active material by this reduction reaction. The negative electrode active materials heretofore used by the individual skilled in the art can be used without particular limitation. A specific example of the negative electrode active material is a particulate carbon material (carbon particles), at least a portion of which has a graphite structure (layer structure). In addition, various carbon materials may be used, e.g., so-called graphitic carbon materials (graphite), hard-to-graphitize carbonaceous materials (hard carbon), easy-to-graphitize carbonaceous materials (soft carbon), and carbon materials having a structure that combines these.

Among the preceding, graphite particles of, e.g., graphite, are particularly preferably used. Graphite particles have an excellent electrical conductivity due to their excellent incorporation of the lithium ion charge carrier, and have a small particle size and thus a large surface area per unit volume, and are therefore advantageous from the standpoint of providing a negative electrode active material well suited to high-rate pulse charge/discharge.

The negative electrode active material layer 44 may also contain, as an additive, a sacrificial auxiliary material that has a potential (potential versus the lithium reference electrode) more noble than the potential of the negative electrode active material and that is a material that reductively degrades the aforementioned additive accompanying charging of the secondary battery cells 101 of the lithium secondary battery 100.

The oxides and sulfides of transition metals, e.g., titanium oxides and sulfides, are examples of this sacrificial auxiliary material, which can be more specifically exemplified by lithium titanate, titanium oxide ($TiO_2$), titanium sulfide, tungsten oxide, molybdenum oxide, cobalt oxide, and iron sulfide. Lithium titanate is particularly preferred, and $Li_{4+x}Ti_5O_{12}$ ($0 \leq x \leq 3$) and $Li_{2+x}Ti_3O_7$ ($0 \leq x \leq 3$) are even more preferred.

As necessary, the negative electrode active material layer 44 may contain other components (optional components) available in this technical field, such as a binder. Those binders generally used in the negative electrodes of lithium secondary batteries may be used as appropriate as this binder. For example, use may be made of a suitable selection from the same binders as referenced above for use as the binder in the positive electrode active material layer 34.

(The Non-Aqueous Electrolyte)

The non-aqueous electrolyte used in the secondary battery cells 101 of a lithium secondary battery 100 contains suitable additives (for example, a barrier-forming agent for forming a coating that protects the negative electrode and negative electrode active material) in addition to a non-aqueous solvent and a lithium salt used as a supporting electrolyte (supporting salt).

Non-aqueous electrolytes available in this technical field can be used as appropriate as this non-aqueous electrolyte, and there is no particular limitation on the type of this non-aqueous electrolyte. For example, various organic solvents can be used, more preferably aprotic solvents such as carbonates, esters, ethers, nitriles, sulfones, and lactones. In specific terms, use may be made of a single selection or the combination of two or more selections from non-aqueous electrolytes generally usable in the electrolyte solutions of lithium secondary batteries, for example, carbonates such as ethylene carbonate (EC), propylene carbonate (PC), diethyl carbonate (DEC), dimethyl carbonate (DMC), and ethyl methyl carbonate (EMC), and also 1,2-dimethoxyethane, 1,2-diethoxyethane, tetrahydrofuran, 2-methyltetrahydrofuran, dioxane, 1,3-dioxolane, diethylene glycol dimethyl ether, ethylene glycol dimethyl ether, acetonitrile, propionitrile, nitromethane, N,N-dimethylformamide, dimethyl sulfoxide, sulfolane, and γ-butyrolactone.

The lithium salt used as a supporting electrolyte (supporting salt) can be specifically exemplified by the various lithium salts capable of functioning as a supporting electrolyte in the electrolyte solutions of lithium secondary batteries, e.g., $LiPF_6$, $LiBF_4$, $LiN(SO_2CF_3)_2$, $LiN(SO_2C_2F_5)_2$, $LiCF_3SO_3$, $LiC_4F_9SO_3$, $LiC(SO_2CF_3)_3$, and $LiClO_4$, but there is no particular limitation to these. A single lithium salt may be used by itself or a combination of two or more lithium salts may be used. $LiPF_6$ is particularly preferred among the preceding. There are no particular limitations on the concentration in the non-aqueous electrolyte of the lithium salt supporting electrolyte, and this concentration can be set as appropriate in conformity with the required performance and the composition can be the same as for the non-aqueous electrolytes heretofore used in lithium secondary batteries.

(The Control Unit)

The control unit 200 functions to control the current input into or output from the secondary battery cells 101 of the lithium secondary battery 100, and includes a processing unit, storage device, input/output interface (none of these are shown), and so forth. In addition, the control unit 200 also functions to store and manage the use history (operating history, e.g., timewise input/output history and so forth) and battery characteristics of each of the secondary battery cells 101, each secondary battery stack constituted of these cells, and the secondary battery pack constituted of these stacks.

<The Secondary Battery Reuse Method>

Figure 4B:
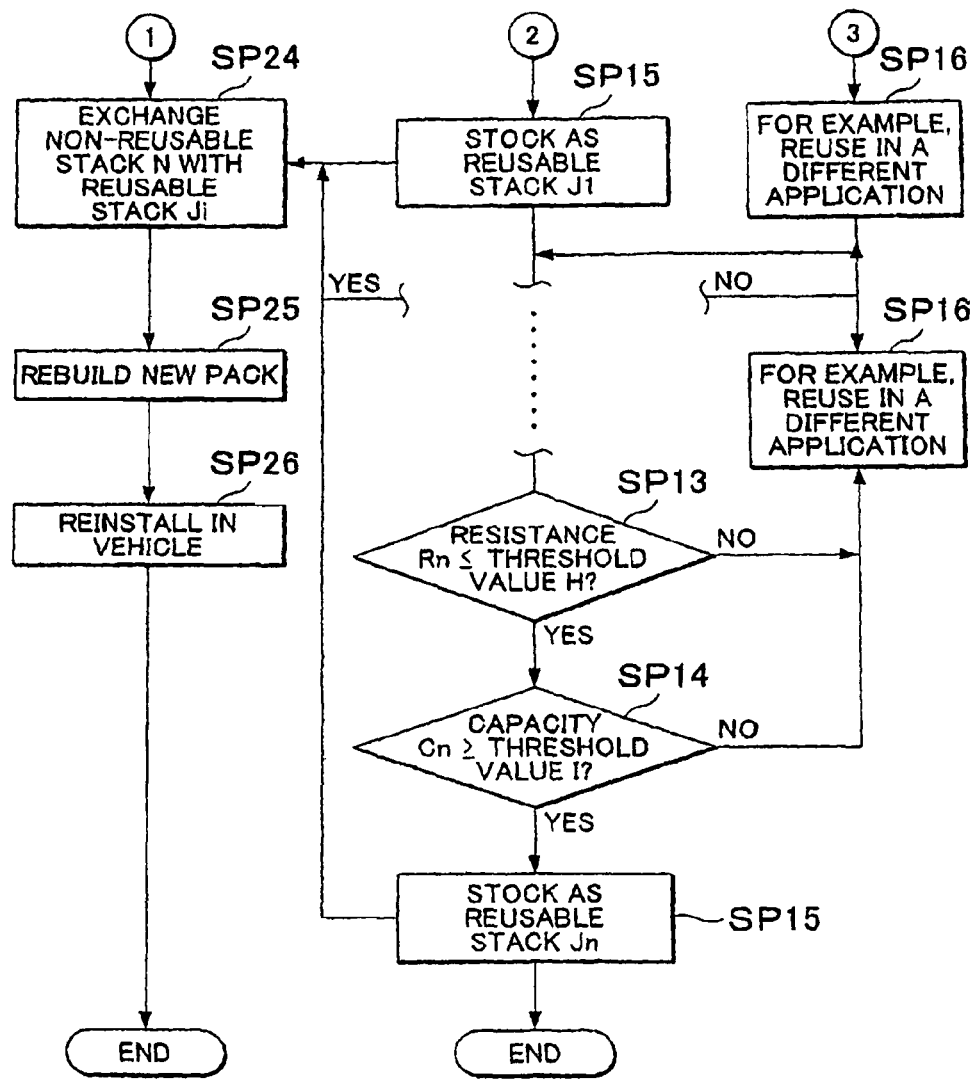

A description follows for one example of the secondary battery reuse method according to the invention, in which reuse is carried out on a secondary battery cell 101 unit basis or a secondary battery stack unit basis after a lithium secondary battery 100 having the hereinabove described structure has been placed in service. FIGS. 4A and 4B are flow diagrams that show an example of the procedure in a preferred embodiment of secondary battery reuse according to the invention.

Here, once one of the plurality of secondary battery packs constituting a particular lithium secondary battery 100 has become unusable, the reusable secondary battery stacks are sorted out from among the plurality of secondary battery stacks making up this secondary battery pack. An embodiment will also be described in which a new secondary battery pack is constructed by exchanging such a reusable secondary battery stack with a non-reusable secondary battery stack present in another secondary battery pack (this may be from the same lithium secondary battery 100 or from another lithium secondary battery).

First, as described in FIG. 4A, when an unusable secondary battery pack (the first secondary battery pack) is returned (step SP11), the resistance Ri and capacity Ci are measured on the plurality of secondary battery stacks Ni (i is an integer from 1 to n; this also applies in the following) constituting this secondary battery pack G (step SP12). Then, the measured resistance R1 of the secondary battery stack N1 is compared with a preset resistance threshold value H (the first threshold value) (step SP13), and, when this resistance R1 is less than or equal to the resistance threshold value H (R1≤H), the measured capacity C1 of the secondary battery stack N1 is compared with a preset capacity threshold value H (the second threshold value) (step SP14). When this capacity C1 is greater than or equal to the capacity threshold value I (C1≥1), this secondary battery stack N1 is determined to be a reusable secondary battery stack (reusable module) and is temporarily placed in stock (storage) (step SP15, follows to 2 in FIG. 4B).

On the other hand, when the resistance R1 of the secondary battery stack N1 is larger than the resistance threshold value H (R1>H) or when the capacity C1 of the secondary battery stack N1 is less than the capacity threshold value I (C1<1), the secondary battery stack N is determined to be non-reusable (a non-reusable module). For example, it is supplied to reuse in a different service other than in a secondary battery pack present in a lithium secondary battery 100 for in-vehicle service (step SP16, follows to 3 in FIG. 4B; however, this also includes disposal, which also applies in the following).

Figure 5:
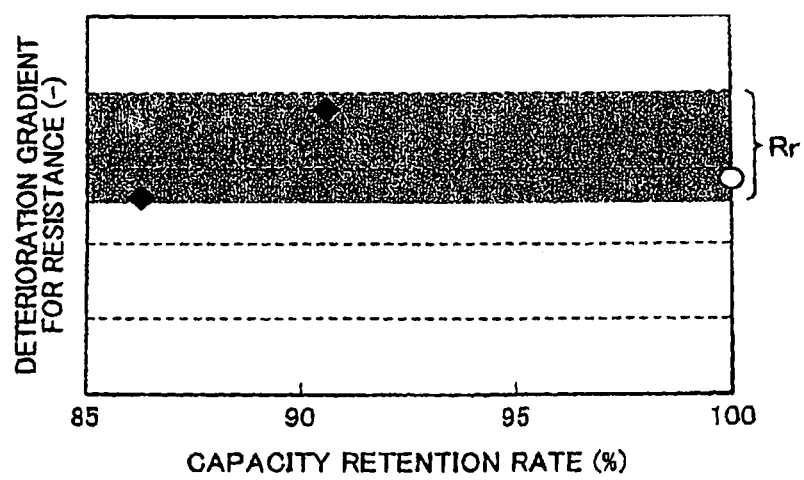
FIG. 5 is a graph that shows the results of measurement of the deterioration gradient of the resistance for a used module and an unused module.

The condition for setting the resistance threshold value H and the capacity threshold value I in this embodiment will now be described with reference to FIG. 5 to FIG. 8. FIG. 5 is a graph that shows the results of measurement in this embodiment of the deterioration gradient of the resistance for a used module and an unused module (degree of deterioration in the resistance; rate of increase in the resistance per a fixed time interval or a fixed travel distance). FIG. 6 is a graph that shows the results of measurement in this embodiment of the deterioration gradient of the capacity for a used module and an unused module (degree of deterioration in the capacity; rate of decline in the capacity per a fixed time interval or a fixed travel distance).

In FIG. 5 and FIG. 6, the plot shown by the filled diamond (♦) represents used modules (capacity retention rate=approximately 86%, approximately 90%), while the plot shown by the open circle (○) represents an unused module (capacity retention rate=100%). According to these results, the deterioration gradient for module resistance (FIG. 5) and the deterioration gradient for module capacity (FIG. 6) were confirmed to be within the ranges Rr, Rc shown in grey in the figures for both the unused and used modules. This confirmed for this embodiment that, for a used module having a resistance and capacity within certain ranges, there is no substantial difference from the unused module relative to their (resistance and capacity) degree of deterioration and they were equal to each other.

Figure 8:
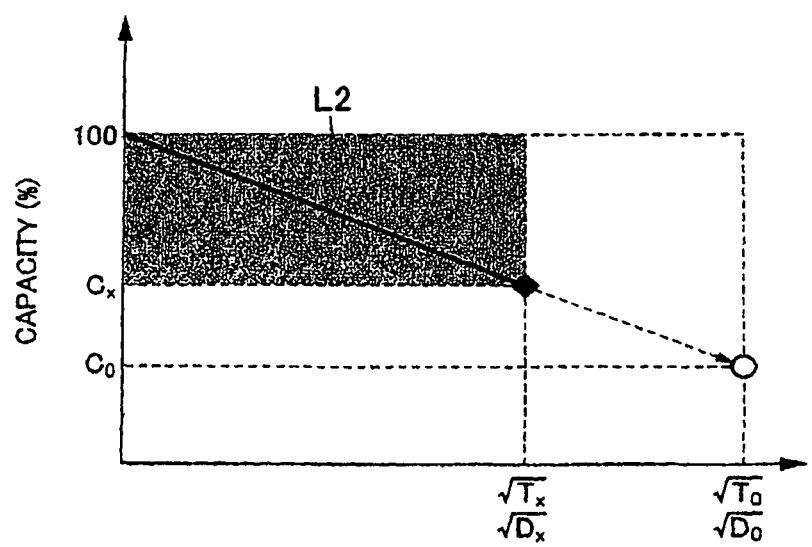
FIG. 8 is graph that conceptually illustrates an example of a method for setting the capacity threshold value I for determining whether a used module is reusable.

FIG. 7 is a graph that conceptually illustrates the method in this embodiment for setting the previously described resistance threshold value H for determining whether a used module is reusable, using the aforementioned condition that the deterioration gradients for the resistance of the used module and unused module are equal. In addition, FIG. 8 is a graph that conceptually illustrates the method in this embodiment for setting the previously described capacity threshold value I for determining whether a used module is reusable, using the aforementioned condition that the deterioration gradients for the capacity of the used module and unused module are equal. In FIG. 7 and FIG. 8, the plot shown by the filled diamond (◆) also represents used modules while the plot shown by the open circle (○) represents a module after the elapse of the target life of the unused module.

In FIG. 7, the target life of the unused module is, for example, $T_0$ (years) or $D_0$ (km), and the case is shown in which the resistance increases to $R_0$ by a constant deterioration gradient (slope of the straight line L1: corresponds to a value within the range Rr in FIG. 5) according to a root law from its initial state (vertical axis in the graph=1.00) to its target life. In this case letting the number of years in use for the used module be $T_x$ (years) and the distance traveled by the vehicle be $D_x$ (km), the maximum resistance value Rx allowed for reuse of this used module is determined from the slope of the straight line L1.

Proceeding in this manner, in this embodiment the value provided by multiplying the initial value of the resistance by its maximum value Rx (multiplication by, for example, a suitable safety factor may also be performed as necessary) can be set for the resistance threshold value H. Here, the ratio of the resistance threshold value H to the initial value may conceptually be any value within the gray-shaded range in the graph in FIG. 7 (that is, less than or equal to the maximum resistance value Rx).

In FIG. 8, the target life of the unused module is, for example, $T_0$ (years) or $D_0$ (km), and the case is shown in which the capacity declines to $C_0$ by a constant deterioration gradient (slope of the straight line L2: corresponds to a value within the range Rc in FIG. 6) according to a root law from its initial state (vertical axis in the graph=100(%)) to its target life. In this case letting the number of years in use for the used module be $T_x$ (years) and the distance traveled by the vehicle be $D_x$ (km), the minimum capacity value Cx allowed for reuse of this used module is determined from the slope of the straight line L2.

Proceeding in this manner, in this embodiment the value provided by multiplying the initial value of the capacity by its minimum value (multiplication by, for example, a suitable safety factor may also be performed as necessary) can be set for the capacity threshold value I. Here, the ratio of the capacity threshold value I to the initial value may conceptually be any value within the gray-shaded range in the graph in FIG. 8 (that is, greater than or equal to the minimum capacity value Cx).

Returning to FIGS. 4A and 4B, in this embodiment the previously described steps SP13 to SP16 are performed on the secondary battery stacks Nn beginning with secondary battery stack N2, and a secondary battery stack N1 with a measured resistance Ri less than or equal to the resistance threshold value H and with a measured capacity Ci greater than or equal to the capacity threshold value I is determined to be a reusable secondary battery stack (reusable module) and is temporarily placed in stock (storage). In addition, a secondary battery stack Ni having a measured resistance Ri greater than the resistance threshold value H or a measured capacity Ci smaller than the capacity threshold value I is determined to be a non-reusable secondary battery stack (non-reusable module) and is supplied to, for example, reuse in a different application.

On the other hand, for a separate secondary battery pack A (the second secondary battery pack) composed of secondary battery stacks of the same type as the secondary battery pack G and returned as unusable (step SP21), in this embodiment the resistance Ri and the capacity Ci of the plurality of secondary battery stacks making up this secondary battery pack A are measured (step SP22) as in step SP12. Then, as in steps SP13 and SP14, the measured resistance Ri and capacity Ci of each secondary battery stack are compared, respectively, with the preset resistance threshold value H and capacity threshold value I and are sorted into reusable secondary battery stacks and non-reusable secondary battery stacks and the latter are identified (step SP23).

A non-reusable secondary battery stack identified in the secondary battery pack A of this embodiment is then exchanged (step SP24) with a reusable secondary battery stack Ji in the secondary battery pack G that has been determined to be reusable and has been temporarily placed in stock. A new secondary battery pack is formed (step SP25) by rebuilding by combining this secondary battery, stack Ji with the secondary battery stacks in secondary battery pack A that have been determined to be reusable. Finally, the sequence of processes is completed by installing a new lithium secondary battery 101 provided with this new secondary battery pack in a vehicle 1.

Based on the previously indicated condition that the deterioration gradients for the resistance and capacity of a used module are equal to the deterioration gradients for the resistance and capacity of an unused module, the secondary battery reuse method of this embodiment having the sequence described above makes possible a reliable and facile discrimination of reusable modules from non-reusable modules. This is done by comparing the measured resistance R1 and capacity C1 for each secondary battery stack (module) in an unusable secondary battery pack G in a lithium secondary battery 100 with a resistance threshold value H and a capacity threshold value I, respectively.

Accordingly, a lithium secondary battery provided with a new secondary battery pack that exhibits a desirable battery performance can be obtained by rebuilding by combining a reusable used module identified in the secondary battery pack G of this embodiment with a reusable module (a module equivalent to an unused module) identified in a separate secondary battery pack A. As a result, this embodiment can effectively prevent the appearance of problems and malfunctions caused by variations in performance between a used module and an unused module or a module equivalent to an unused module, and can contribute to a more efficient and safer effective utilization of the lithium secondary battery 100 and its material resources and can contribute to promoting same.

In addition, operating control, i.e., control of a desirable charging and discharge, in the vehicle 1 of this embodiment that is provided with a lithium secondary battery 101 having this newly built secondary battery pack may be carried out based on the use history and/or battery characteristics of the used module that has been rated as reusable. When this is done, the appearance in a new secondary battery pack according to this embodiment that combines a reusable module with an unused module of unforeseeable malfunctions and problems in the used reusable module can be more reliably prevented than is the case where charge/discharge control is carried out on the secondary battery pack based on values obtained by simply averaging the use history and battery characteristics of each of the modules.

The following method may be carried out as an example of a more specific operating control: reducing the state of charge (SOC) use range of the secondary battery pack in conformity to the output or capacity of the deteriorated battery and determining the use range of the secondary battery pack in conformity to the output or capacity of the deteriorated battery. In this case, management in each specific process is carried out based on instructions from the control unit 200 and the variously required processing can also be carried out at the control unit 200.

As noted above, the invention is not limited to the embodiments described in the preceding, and various modifications are possible as long as the essential features of the invention are not altered. For example, the sequence shown in FIG. 4 for step SP13 and step SP14 may be reversed, or these two steps may be carried out concurrently (simultaneously). In addition, steps SP12, SP13, and SP14 (measurement of the resistance Ri and capacity Ci and comparison with the threshold values H and I) may be carried out concurrently (simultaneously). Moreover, a new secondary battery pack may be constructed (built) by combining a module that is a new and unused product with a module determined to be reusable at secondary battery pack G.

As has been described above, the secondary battery reuse method of the invention makes it possible to reliably and conveniently select a reusable module from a used secondary battery and to build a secondary battery that is provided with a new secondary battery pack that can exhibit a desirable battery performance and avoids the appearance of, for example, malfunctions. Because this can promote a more efficient and safer effective utilization of secondary batteries and their material resources, the secondary battery reuse method of the invention can be broadly and effectively utilized for the general reuse of secondary batteries, for vehicles in general that can use a secondary battery as a vehicle drive power source, and in the production and use of the preceding.

The invention claimed is:

1. A secondary battery reuse method for a secondary battery including a secondary battery pack having a plurality of modules, each module being formed of a secondary battery cell or a secondary battery stack containing a plurality of secondary battery cells, the method comprising:
    measuring a resistance and a capacity of each module;
    comparing the measured resistance of each module with a preset first threshold value;
    comparing the measured capacity of each module with a preset second threshold value;
    determining a module to be a reusable module when its measured resistance is less than or equal to the first threshold value and its measured capacity is greater than or equal to the second threshold value;
    determining a module to be a non-reusable module when its measured resistance is larger than the first threshold value or its measured capacity is less than the second threshold value; and
    constructing a new secondary battery pack by combining the reusable module with an unused module or a module equivalent to the unused module, and placing a secondary battery provided with this new secondary battery pack in use,
    wherein the first threshold value and the second threshold value are set using as a condition that a degree of deterioration in the resistance and a degree of deterioration in the capacity of a module in a secondary battery pack in a used secondary battery are respectively equal to a degree of deterioration in the resistance and a degree of deterioration in the capacity of a module in a secondary battery pack prior to use.

2. The secondary battery reuse method according to claim 1, wherein the new secondary battery pack is constructed by combining the unused module, or the module equivalent to the unused module, with a module in a used first secondary battery pack determined to be reusable.

3. The secondary battery reuse method according to claim 1, wherein the new secondary battery pack is constructed by exchanging a module determined to be reusable in a used first secondary battery pack, with a module in a used second secondary battery pack that is different from the first secondary battery pack determined to be non-reusable.

4. The secondary battery reuse method according to claim 1, wherein the new secondary battery pack is constructed by combining the unused module with a module in a used first secondary battery pack determined to be reusable.

5. The secondary battery reuse method according to claim 1, wherein the module in the secondary battery pack is provided with an electrode assembly that has a positive electrode containing a positive electrode active material, a negative electrode containing a negative electrode active material, and a non-aqueous electrolyte solution containing a lithium salt in a non-aqueous solvent, and
    the secondary battery pack is used as a vehicle drive power source mounted in a vehicle.

6. A vehicle drive power source comprising:
    a secondary battery that is mounted in a vehicle and that has the new secondary battery pack constructed by the secondary battery reuse method according claim 1.

7. A vehicle co p swag:
    the vehicle drive power source according to claim 6.

8. The vehicle according to claim 7, further comprising:
    a control unit that controls an operation of a secondary battery pack having a plurality of modules, each module being formed of a secondary battery cell or a secondary battery stack containing a plurality of secondary battery cells, wherein
    the control unit controls an operation of the new secondary battery pack based on use history and/or battery characteristics of the reusable module.

* * * * *